Figure 1:
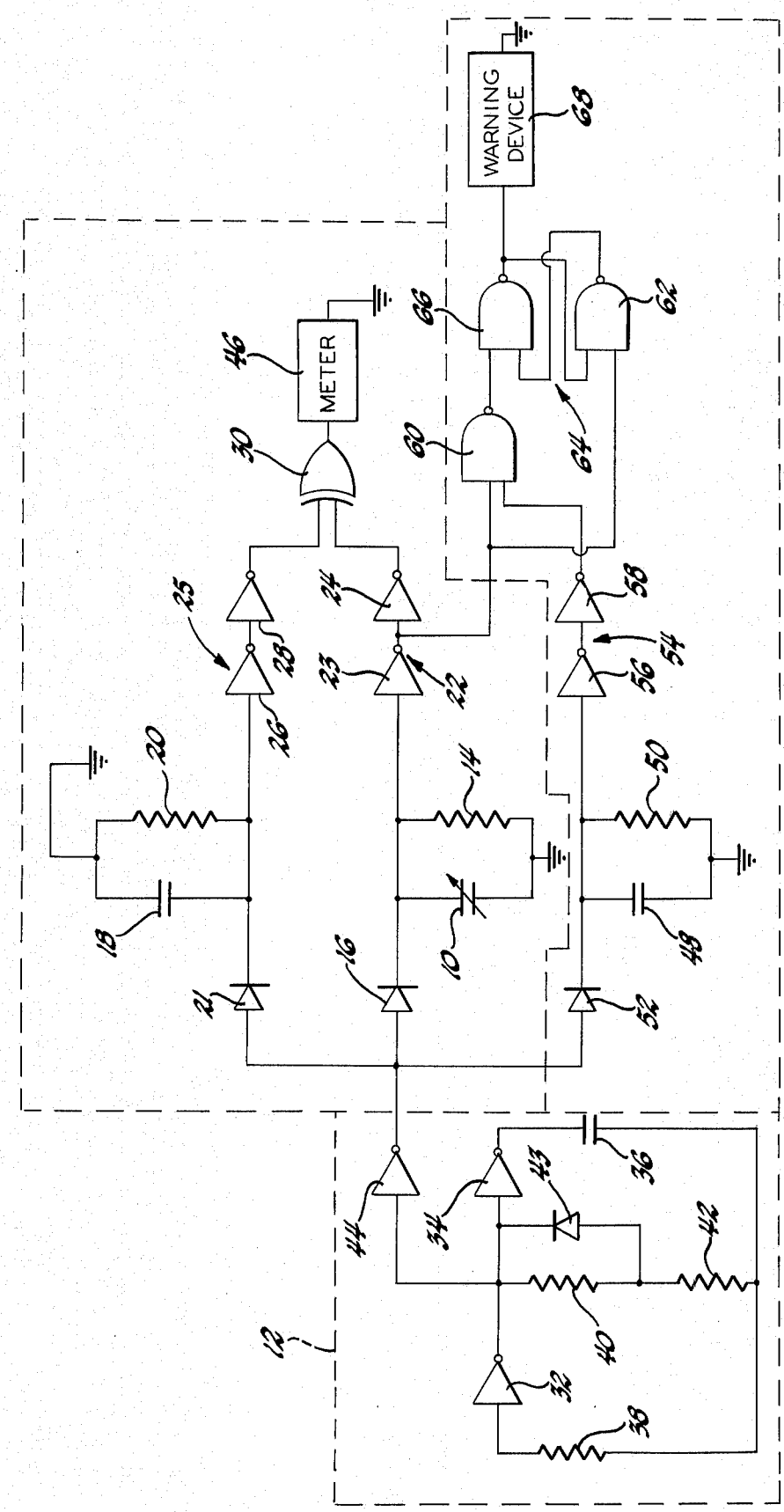

United States Patent [19]

Hile et al.

[11] 4,001,676
[45] Jan. 4, 1977

[54] SOLID-STATE THRESHOLD DETECTOR

[75] Inventors: John W. Hile, Birmingham; Paul R. Rabe, Sterling Heights, both of Mich.

[73] Assignee: General Motors Corporation, Detroit, Mich.

[22] Filed: Aug. 27, 1975

[21] Appl. No.: 608,076

[52] U.S. Cl. .................. 324/60 CD; 73/304 C; 307/235 R
[51] Int. Cl.² ......................... G01R 27/26
[58] Field of Search .......... 324/60 CD, 61 R; 73/304 C; 317/246; 307/235 R

[56] References Cited
UNITED STATES PATENTS

| | | | |
|---|---|---|---|
| 3,824,459 | 7/1974 | Uchida | 324/60 CD |
| 3,863,147 | 1/1975 | Erath | 324/60 CD |
| 3,931,610 | 1/1976 | Marin et al. | 324/60 CD X |

*Primary Examiner*—Stanley T. Krawczewicz
*Attorney, Agent, or Firm*—Howard N. Conkey

[57] ABSTRACT

An apparatus for providing a warning when the magnitude of a monitored parameter, such as vehicle fuel level, is within a critical range. A charge pump repeatedly charges a variable capacitor having a capacitance progressively changing with the magnitude of the monitored parameter and a reference capacitor having a capacitance equal to the capacitance of the variable capacitor when the magnitude of the monitored parameter is at the threshold of the critical range. After each charge, the two capacitors are discharged at a controlled rate with their voltage charge being monitored by threshold detectors, each of which provides an output when the voltage across the respective capacitor exceeds a specified level. The outputs of the threshold detectors are coupled to a logic circuit which compares the duration of the outputs of the threshold detectors and generates an output when the duration of the output from the level detector monitoring the reference capacitor varies from the time duration of the output from the level detector monitoring the reference capacitor in a sense representing a critical magnitude of the condition. An indicator is responsive to the output signal from the logic circuit for providing a warning of the critical magnitude of the condition.

2 Claims, 2 Drawing Figures

SOLID-STATE THRESHOLD DETECTOR

This invention relates to an apparatus for providing an indication when the magnitude of a monitored condition is within a critical range. The present invention has particular utility in a liquid level indicator and warning circuit which utilizes a capacitance probe immersed in the liquid whose level is to be monitored, wherein the capacitance of the probe is a function of the degree of submersion of the probe in the liquid.

In copending application Ser. No. 535,175, assigned to the assignee of the present invention, there is described a capacitance measuring apparatus which provides a signal representing the capacitance of an unknown capacitor. This form of capacitance measuring apparatus may be used to provide a continuous indication of the magnitude of a monitored parameter which varies the capacitance of a sensing capacitor. The threshold detector of this invention is directed to the form of capacitance measuring circuit described in the aforementioned copending application.

It is the general object of this invention to provide an apparatus for providing an indication when the magnitude of a variable parameter monitored by a variable capacitor is within a critical range.

It is another object of this invention to provide a circuit for monitoring the capacitance of a variable capacitor responsive to a sensed parameter to provide an indication when the magnitude of the sensed parameter is within a critical range.

These and other objects of this invention are accomplished by means of a charge pump which repeatedly charges a variable capacitor having a capacitance progressively varying with the magnitude of a monitored parameter and a reference capacitor having a capacitance equal to the capacitance of the reference capacitor when the magnitude of the monitored parameter is at the threshold of a critical range. The capacitors are then discharged simultaneously through identical resistors with the voltages across the capacitors being coupled to respective threshold detectors. Each of the threshold detectors generates a digital output when the input thereto exceeds a specified level. The output of each of the threshold detectors is a series of digital pulses each of which has a duration representing the magnitude of the measured capacitance. The digital pulses are supplied to a logic network which generates an output when the time duration of the pulses from the level detector monitoring the variable capacitor varies from the time duration of the pulses from the threshold detector monitoring the voltage across the reference capacitor in a sense which represents that the magnitude of the monitored condition is within the critical range.

Figure 2:
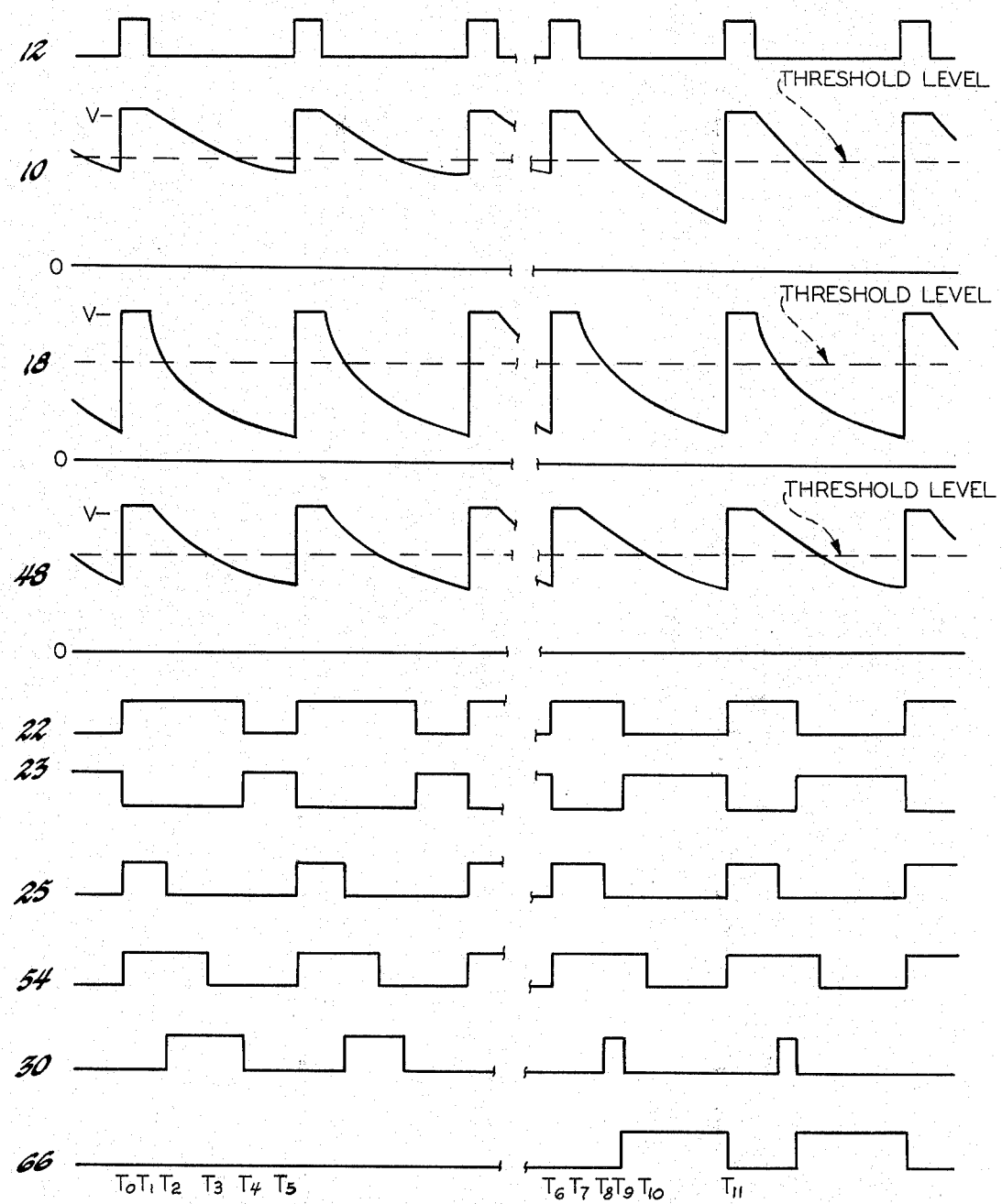

The invention may be best understood by reference to the following description of a preferred embodiment and the drawings in which:

FIG. 1 is a schematic diagram of the apparatus of this invention for providing an indication when the magnitude of a monitored condition is within a critical range; and FIG. 2 is a timing and voltage diagram for the apparatus of FIG. 1.

The preferred embodiment will be described with reference to a liquid level monitoring device using a capacitance probe for purposes of illustration. It is understood that the apparatus may be used to monitor other variable parameters such as force or distance.

Referring to FIG. 1, a variable liquid level measuring capacitor 10 monitors the liquid level in a container and presents a capacitance which progressively changes with changing levels of the liquid in the container. The variable capacitor 10 may take the form of a capacitance probe immersed in the container and which has a capacitance which is a function of the degree to which the probe is submerged in the liquid.

A charge pump 12 having a low output impedance generates repeated charge pulses which are applied to one side of the parallel combination of the variable capacitor 10 and a resistor 14 through a diode 16. The other side of the parallel combination of the variable capacitor 10 and the resistor 14 is grounded. The charge pulses from the charge pump 12 are also applied to one side of the parallel combination of a reference capacitor 18 and a resistor 20 through a diode 21. The remaining side of the parallel combination of the reference capacitor 18 and the resistor 20 is grounded.

The voltage across the variable capacitor 10 is coupled to the input of a threshold detector 22 comprised of series coupled inverters 23 and 24. The threshold level of the threshold detector 22 is determined by the trigger level of the inverter 23 which generates a digital logic 0 at its output when the magnitude of the voltage at its input exceeds its trigger level and generates a digital logic 1 when the voltage at its input is below its trigger level. The inverter 24 functions to invert the output of the inverter 23 such that the output of the threshold detector is a digital logic 1 when the voltage across the capacitor 10 is above the trigger level of the inverter 23 and is a digital logic 0 when the voltage across the capacitor 10 is below the trigger level of the inverter 23.

The voltage across the capacitor 18 is coupled to the input of a threshold detector 25 identical to the threshold detector 22. The threshold detector 25 is comprised of series coupled inverters 26 and 28. When the voltage charge across the capacitor 18 exceeds the threshold or trigger level of the inverter 26, the output of the threshold detector 25 is a digital logic 1 and when the voltage charge is below the trigger level of the inverter 26, the output of the threshold detector 25 is a digital logic 0.

The inverters 23 and 26 are chosen such that they have very high input impedances relative to the resistors 14 and 20 and very low input capacitance relative to the reference capacitor 18 and all capacitance values of the variable capacitor 10.

The outputs of the inverters 24 and 28 are coupled to respective inputs of an EXCLUSIVE OR gate 30. The EXCLUSIVE OR gate 30 functions to generate a digital logic 1 when either one or the other but not both of the inputs thereof is at a digital logic 1.

The charge pump 12 is a low dutycycle astable multivibrator with a low impedance, buffered output. The charge pump 12 includes an inverter 32 having its output coupled to the input of an inverter 34. The output of the inverter 34 is coupled to the input of the inverter 32 through a capacitor 36 and a resistor 38. A resistor 40 and a resistor 42 are series coupled between the output of the inverter 32 and the junction between the capacitor 36 and the resistor 38. A diode 43 is coupled in parallel with the resistor 40. The output of the inverter 32 is coupled to the input of a buffer inverter 44 whose output constitutes the output of the charge pump 12 which is a series of positive going voltage pulses.

The circuit elements described are chosen such that each charge pulse output of the charge pump 12 has a duration sufficient to charge the variable capacitor 10 and the reference capacitor 18 to a level above the threshold level of the threshold detectors 22 and 25. During the periods between the charge pulses at the output of the charge pump 12, the diodes 16 and 21 present a very large impedance from the variable capacitor 10 and the reference capacitor 18 to the output of the charge pump 12 to prevent their discharge into the output of the charge pump 12. During this period between charge pulses, the variable capacitor 10 and reference capacitor 18 discharge through the respective resistors 14 and 20. The rate of voltage decay on each of the capacitors 10 and 18 is a direct function of the value of the capacitance thereof. The circuit elements of the charge pump 12 are further selected so that the period between charge pulses is of a sufficient duration so that for all expected values of the variable capacitor 10, there is a sufficient time period for each of the capacitors 10 and 18 to discharge to a level below the threshold level of the threshold detectors 22 and 25.

The resulting output of the EXCLUSIVE OR gate 30 is a series of digital logic 1 pulses each of which has a time duration representing the magnitude of the variable capacitor 10 and consequently the level of fluid monitored thereby. This output is coupled to an integrating meter 46 which may be either digital or analog to provide a continuous indication of the fluid level. The voltage waveforms across the variable capacitor 10 and the reference capacitor 18 and the timing diagram illustrating the logic state outputs of the various elements of the circuit described are illustrated in FIG. 2.

Since the output of the EXCLUSIVE OR gate 30 represents the absolute magnitude of the difference in capacitance between the variable capacitor 10 and the reference capacitor 18, the capacitance of the reference capacitor 18 must not be within the range of capacitance of the variable capacitor 10 in order to prevent an ambiguous indication of capacitance and consequently fluid level. Therefore, the capacitance of the reference capacitor 18 must be equal to or less than a lower limit of capacitance of the variable capacitor 10 or equal to or greater than an upper limit of capacitance of the variable capacitor 10, the upper and lower limits being determined by a full and empty container when fluid level is being monitored. As can be seen, by making the capacitance of the reference capacitor 18 equal to either the upper or lower limit of the capacitance of the variable capacitor 10, a zero level for a measuring circuit can be established.

The foregoing described circuit is substantially identical to the capacitance measuring circuit described in copending application Ser. No. 535,175 assigned to the assignee of this invention.

To provide for a warning when the level of fluid monitored by the variable capacitor 10 is within a critical range, a circuit is provided in FIG. 1 which may be used in conjunction with the circuit for providing a continuous indication of liquid level or may be used independently thereof for providing an indication when the level is within a critical range. The circuit for providing the warning when the fluid level is within the critical range includes the parallel combination of a second reference capacitor 48 and a resistor 50, the resistance of which is equal to the resistance of the resistors 14 and 20. One side of the parallel combination of the capacitor 48 and the resistor 50 is grounded and the other side thereof is coupled to the cathode of a diode 52 whose anode is coupled to the output of the charge pump 12. The charge pulses from the charge pump 12 are thereby coupled across the capacitor 48 through the diode 52.

The voltage across the reference capacitor 48 is coupled to the input of a threshold detector 54 comprised of an inverter 56 and an inverter 58. The threshold level of the threshold detector 54 is determined by the trigger level of the inverter 56 which is identical to the trigger level of the inverters 23 and 26. The inverter 58 functions to invert the output of the inverter 56 such that the output of the threshold detector 54 is a digital logic 1 when the voltage charge across the capacitor 48 is above the trigger level of the inverter 56 and is a digital logic 0 when the voltage across the capacitor 48 is below the trigger level of the inverter 56.

The output of the threshold detector 54 is coupled to one input of a NAND gate 60. The output of the inverter 23 comprising the inverse of the output of the threshold detector 22 is coupled to a second input of the NAND gate 60 and to one input of a NAND gate 62 of a latch circuit 64. The output of the NAND gate 60 is coupled to one input of a NAND gate 66 in the latch circuit 64. The output of the NAND gate 66 is coupled to a second input of the NAND gate 62 and the output of the NAND gate 62 is coupled to a second input of the NAND gate 66 to complete the latching circuit 64. The output of the latching circuit 64 at the output of the NAND gate 66 is coupled to a warning device 68 which is energized when the output of the latching circuit 64 is a digital logic 1.

The magnitude of the capacitance of the capacitor 48 is selected to be equal to the capacitance of the variable capacitor 10 when the fluid level monitored thereby decreases to a threshold of a critical level at which a warning is desired. The NAND gate 60 functions to monitor the pulse width outputs of the threshold detector 22 and the threshold detector 54 and provide an output to the latch circuit 64 when the time duration of the output of the threshold detector 24 varies from the time duration of the output of the threshold detector 54 in a sense which represents that the magnitude of the capacitor 10 is less than the magnitude of the capacitor 48 and therefore that the level of fluid is within the critical range.

The operation of the circuit will be described with reference to the timing and voltage diagrams of FIG. 2. At time $T_0$, the charge pump 12 generates a charge pulse which is coupled across the variable capacitor 10, the reference capacitor 18 and the reference capacitor 48. The variable capacitor 10 and the reference capacitors 18 and 48 are quickly charged to a specified voltage level V above the threshold level of the threshold detectors 22, 25 and 54. The outputs of the threshold detectors 22, 25 and 54 then shift to a digital logic 1. Consequently, the output of the EXCLUSIVE OR gate 30 is a digital logic 0 and the output of the NAND gate 66 is a digital logic 0.

At time $T_1$, the charge pulse at the output of the charge pump 12 shifts to ground potential and the variable capacitor 10 and the reference capacitors 18 and 48 begin to discharge through their respective resistors 14, 20 and 50 at a rate determined by their respective capacitances.

At time $T_2$, the voltage across the reference capacitor 18 decreases to the threshold level of the threshold detector 25 whose output shifts from a digital logic 1 to a digital logic 0. As the output of the threshold detector 25 remains a digital logic 1, the output of the EXCLUSIVE OR gate 30 shifts to a digital logic 1.

At time $T_3$, the voltage across the reference capacitor 48 decreases to the threshold level of the threshold detector 54. Consequently, the output of the threshold detector 54 shifts from a digital logic 1 to a digital logic 0. The output of the NAND gate 60 remains a digital logic 1 and the output of the NAND gate 66 remains a digital logic 0.

At time $T_4$, the voltage across the variable capacitor 10 decreases to the threshold level of the threshold detector 22 whose output shifts to a digital logic 0. As each input to the EXCLUSIVE OR gate 30 is then a digital logic 0, the output thereof shifts to a digital logic 0. The time duration of the digital logic 1 pulse output from the EXCLUSIVE OR gate 30 represents the difference between the capacitance of the variable capacitor 10 and the reference capacitor 18 and is a measure of the fluid level being monitored by the variable capacitor 10. At time $T_4$, the input to the NAND gate 60 from the threshold detector 54 remains a logic 0 so that the output of the NAND gate 66 remains at a digital logic 0.

At time $T_5$, the cycle is repeated. The resulting waveform output of the EXCLUSIVE OR gate 30 is a series of pulses each of which has a time duration which is a function of the value of capacitance of the variable capacitor 10 and consequently the fluid level sensed thereby. The meter 46 integrates the pulses and provides a continuous indication of the magnitude of the fluid level.

The duration of the pulse output of the inverter 22 between times $T_0$ and $T_4$ is greater than the time duration of the pulse output of the threshold detector 54 between times $T_0$ and $T_3$. This represents that the capacitance of the capacitor 10 is greater than the capacitance of the capacitor 4, which condition exists when the fluid level is greater than the critical level. While this condition exists, the output of the NAND gate 60 remains a logic 1 and consequently the output of the latch circuit 64 remains a continuous logic 0 to maintain the warning device 68 deenergized.

To illustrate the operation of the circuit for providing an indication when the fluid level decreases to the critical level below the threshold level determined by the reference capacitor 48, it will be assumed that prior to time $T_6$ the fluid level monitored by the variable capacitor 10 decreases to the critical level. At time $T_6$, the charge pulse from the charge pump 12 is coupled across the variable capacitor 10 and the reference capacitors 18 and 48 which are quickly charged to the specified voltage level V. The outputs of the threshold detectors 22, 25 and 54 therefore shift to a digital logic 1. Consequently, the output of the EXCLUSIVE OR gate 30 is a digital logic 0.

At the time $T_7$, the charge pulse at the output of the charge pump 12 shifts to ground potential and the variable capacitor 10 and the reference capacitors 18 and 48 begin to discharge through their respective resistors 14, 20 and 50.

At time $T_8$, the voltage across the reference capacitor 18 decreases to the threshold level of the threshold detector 25 whose output shifts from a digital logic 1 to a digital logic 0. As the output of the threshold detector 22 remains a digital logic 1, the output of the EXCLUSIVE OR gate 30 shifts to a digital logic 1. The input to the NAND gate 60 from the threshold detector 54 remains a digital logic 0 so that the output of the NAND gate 66 remains a digital logic 0.

At time $T_9$, the voltage across the variable capacitor 10 decreases to the threshold level and the output of the threshold detector 22 shifts to a digital logic 0. As each input to the EXCLUSIVE OR gate 30 is a digital logic 0, the output thereof shifts to a digital logic 0. Also at time $T_9$, both inputs of the NAND gate 60 are a digital logic 1 to cause its output to shift to a digital logic 0. The output of the NAND gate 66 is then shifted to a digital logic 1 to energize the warning device 68. The input to the NAND gate 62 from the inverter 23 at time $T_9$ is a digital logic 1 so that the output thereof shifts to a digital logic 0 to latch the NAND gate 66 to supply a digital logic 1 and maintain the warning device 68 energized.

At time $T_{10}$, the voltage across the reference capacitor 48 decreases to the threshold level of the threshold detector 54 whose output shifts to a digital logic 0 to cause the output of the NAND gate 60 to shift to a digital logic 1. As the other input to the NAND gate 66 from the NAND gate 62 is a digital logic 0, the output thereof remains at a digital logic 1 to maintain the warning device 68 energized.

At time $T_{11}$, the charge pump supplies a charge pulse to charge the reference capacitors 18 and 48 and the variable capacitor 10 to the voltage level V so that the output of the threshold detectors 22, 25 and 54 are shifted to a digital logic 1 to repeat the cycle described beginning at time $T_6$. At this time, the input to the NAND gate 62 from the inverter 23 shifts to a logic 0 to cause the outputs of the NAND gate 60 and 62 to shift to respective logic 1's to shift the output of the NAND gate 66 to logic 0 and deenergize the warning device 68. In the foregoing manner, the warning device 68 is pulsed by the output of the NAND gate 66 to provide an indication that the fluid level monitored by the variable capacitor 10 is within the critical range.

As can be seen, the circuit described monitors the pulse widths of the outputs of the threshold detector 22 and the threshold detector 54 and provides a signal for energizing the warning device 68 when the width of the pulse output of the threshold detector 22 becomes less than the width of the pulse output of the threshold detector 54, the condition which represents a fluid level within the critical range.

Although a specific logic circuit has been illustrated for comparing the pulse widths from the threshold detectors 22 and 54, other logic elements such as AND gates, NOR gates, and OR gates may be utilized in a manner which would be obvious to one skilled in the art. Further, the provision of a warning when the capacitance of the variable capacitor is greater than the capacitance of the reference capacitor may be provided in a manner obvious to one skilled in the art.

The detailed description of the preferred embodiment of the invention for the purpose of explaining the principles thereof is not to be considered as limiting or restricting the invention, since many modifications may be made by the exercise of skill in the art without departing from the scope of the invention.

What is claimed is:

1. A threshold detector circuit for providing an indication of a critical magnitude of a condition, the circuit comprising:
    a first circuit having a first reactor and a first resistor, at least one of which varies in accordance with the magnitude of the condition to define a first time constant determined by the magnitude of the condition, the first time constant varying in a predetermined sense from a critical time constant when the magnitude of the condition is critical;

a reference circuit having a second reactor and a second resistor defining a reference time constant equal to the critical time constant;

means effective to repeatedly set a predetermined voltage across the first and second reactors in unison, the voltage across the first and second reactors varying after each repeated setting at rates determined by the respective time constants of the first and reference circuits;

means responsive to the voltage across the first reactor effective to produce a first series of digital pulses, each digital pulse in the first series being coincident with a respective time period that the voltage across the first reactor varies in a predetermined sense from a predetermined voltage value which is attained during each cycle;

means responsive to the voltage across the second reactor effective to produce a second series of digital pulses, each digital pulse in the second series being coincident with a respective time period that the voltage across the second reactor varies in a predetermined sense from the predetermined voltage value which is attained during each cycle;

a logic gate means coupled to the means responsive to the voltage across the first reactor and the means responsive to the voltage across the second reactor and responsive to the sequence of termination of the digital pulses in the first and second series effective to generate a digital output signal which is initiated upon the termination of a digital pulse in one of the first and second series of digital pulses and terminated by the termination of the other one of the digital pulses in the first and second series when the sequence of termination of the digital pulses in the first and second series of digital pulses represents a time constant of the first circuit varying in the predetermined sense from the critical time constant; and indicator means responsive to the output signal for providing an indication of the critical magnitude of the condition.

2. A threshold detector circuit for providing an indication of a critical magnitude of a condition, the circuit comprising:

a first circuit having a first reactor and a first resistor, at least one of which varies in accordance with the magnitude of the condition to define a first time constant determined by the magnitude of the condition, the first time constant varying in a predetermined sense from a critical time constant when the magnitude of the condition is critical;

a reference circuit having a second reactor and a second resistor defining a reference time constant equal to the critical time constant;

means effective to repeatedly set a predetermined voltage across the first and second reactors in unison, the voltage across the first and second reactors varying after each repeated setting at rates determined by the respective time constants of the first and reference circuits;

means responsive to the voltage across the first reactor effective to produce a first series of digital pulses, each digital pulse in the first series being coincident with a respective time period that the voltage across the first reactor varies in a predetermined sense from a predetermined voltage value which is attained during each cycle;

means responsive to the voltage across the second reactor effective to produce a second series of digital pulses, each digital pulse in the second series being coincident with a respective time period that the voltage across the second reactor varies in a predetermining sense from the predetermined voltage value which is attained during each cycle;

a logic gate means coupled to the means responsive to the voltage across the first reactor and the means responsive to the voltage across the second reactor and responsive to the sequence of termination of the digital pulses in the first and second series effective to generate a digital output signal which is initiated upon the termination of a digital pulse in one of the first and second series of digital pulses and terminated by the termination of the other one of the digital pulses in the first and second series when the sequence of termination of the digital pulses in the first and second series of digital pulses represents a time constant of the first circuit varying in the predetermined sense from the critical time constant;

latch means responsive to the digital output signal to provide an extended digital pulse output; and indicator means responsive to the extended digital pulse output for providing an indication of the critical magnitude of the condition.

* * * * *